United States Patent
Sato et al.

(10) Patent No.: US 8,446,202 B2
(45) Date of Patent: May 21, 2013

(54) POWER LIMITING CIRCUIT

(75) Inventors: Hirotaka Sato, Tokyo (JP); Kimihiko Kono, Tokyo (JP); Yoshiaki Doi, Tokyo (JP); Yoichi Kushioka, Tokyo (JP)

(73) Assignees: NEC Corporation, Tokyo (JP); Hitachi Kokusai Electric Inc., Tokyo (JP)

( * ) Notice: Subject to any disclaimer, the term of this patent is extended or adjusted under 35 U.S.C. 154(b) by 177 days.

(21) Appl. No.: 13/131,967

(22) PCT Filed: Dec. 17, 2009

(86) PCT No.: PCT/JP2009/071512
§ 371 (c)(1),
(2), (4) Date: May 31, 2011

(87) PCT Pub. No.: WO2010/074187
PCT Pub. Date: Jul. 1, 2010

(65) Prior Publication Data
US 2011/0227628 A1 Sep. 22, 2011

(30) Foreign Application Priority Data
Dec. 22, 2008 (JP) .................. 2008-325258

(51) Int. Cl.
*H03L 5/00* (2006.01)
(52) U.S. Cl.
USPC .......... 327/306; 375/297; 455/127.1
(58) Field of Classification Search
USPC ......... 327/306; 375/297; 455/127.1; 370/318
See application file for complete search history.

(56) References Cited

U.S. PATENT DOCUMENTS

| 4,613,990 A * | 9/1986 | Halpern ................ 455/522 |
| 6,094,585 A * | 7/2000 | Dajer et al. ............ 455/522 |
| 6,775,331 B1 | 8/2004 | Shinde |
| 6,920,127 B2 * | 7/2005 | Ozluturk et al. ........ 370/342 |
| 6,922,389 B1 * | 7/2005 | Lundby ................ 370/209 |

(Continued)

FOREIGN PATENT DOCUMENTS

| JP | 2001-086094 | 3/2001 |
| JP | 2004-104162 | 4/2004 |

(Continued)

OTHER PUBLICATIONS

International Search Report, PCT/JP2009/071512, Apr. 6, 2010.

*Primary Examiner* — Kenneth B. Wells
(74) *Attorney, Agent, or Firm* — Young & Thompson

(57) ABSTRACT

A power limiting circuit includes: a maximum value prediction filter section (MVPFS) interpolating data of one branched digital input signal; a maximum value detection section detecting maximum value of an output of the MVPFS and a time detection position thereof every constant period; a threshold subtraction section subtracting a threshold from detected maximum value and outputting a peak signal (zero when the subtraction result is negative); a coefficient selection section weighting the peak signal according to time detection position; a complex filter section limiting the weighted peak signal within a band of the input signal; a filter coefficient calculation section calculating filter coefficients of the complex filter section; a delay adjustment section delaying another of the branched input signals by a time period required for calculating the band-limited peak signal; and a subtraction section subtracting the band-limited peak signal from the other of the branched input signals subjected to delay.

5 Claims, 19 Drawing Sheets

U.S. PATENT DOCUMENTS

| | | | |
|---|---|---|---|
| 6,931,053 B2* | 8/2005 | McGowan | 375/146 |
| 7,012,969 B2* | 3/2006 | Ode et al. | 375/296 |
| 7,164,931 B2* | 1/2007 | Ozluturk et al. | 455/522 |
| 7,319,713 B2* | 1/2008 | Viero et al. | 375/135 |
| 7,346,038 B2* | 3/2008 | Yang et al. | 370/335 |
| 2004/0090283 A1 | 5/2004 | Naito | |
| 2007/0201582 A1 | 8/2007 | Okada et al. | |

FOREIGN PATENT DOCUMENTS

| | | |
|---|---|---|
| JP | 2007-306346 | 11/2007 |
| JP | 2008-078943 | 4/2008 |
| WO | WO 2006/049140 | 5/2006 |

\* cited by examiner

| | P0 | | | | P1 | | | |
|---|---|---|---|---|---|---|---|---|
| | A | B | C | D | A | B | C | D |
| INPUT AMPLITUDE OF POWER LIMITING CIRCUIT | | 1.594 | | | | 2.059 | | |
| DETECTION POSITION | | | | | | | | |
| OUTPUT AMPLITUDE OF MAXIMUM VALUE PREDICTION FIR FILTER SECTION 11 | 1.376 | 1.526 | 1.659 | 1.787 | 1.904 | 2.011 | 2.105 | 2.192 |
| MAXIMUM VALUE DETECTION POSITION | | D | | | | D | | |
| MAXIMUM VALUE | | 1.787 | | | | 2.192 | | |
| THRESHOLD (Th) | | | | 2.113 | | | | |
| MAXIMUM VALUE − THRESHOLD | | −0.327 | | | | 0.078 | | |
| OUTPUT OF THRESHOLD SUBTRACTION SECTION 13 | | 0.000 | | | | 0.078 | | |
| MULTIPLIER OF COEFFICIENT SELECTION SECTION 14 | | 0.600 | | | | 0.600 | | |
| OUTPUT OF COEFFICIENT SELECTION SECTION 14 | | 0.000 | | | | 0.047 | | |

| | P2 | | | | P3 | | | | P4 | | | |
|---|---|---|---|---|---|---|---|---|---|---|---|---|
| | A | B | C | D | A | B | C | D | A | B | C | D |
| | | 2.336 | | | | 2.235 | | | | 1.579 | | |
| | 2.264 | 2.318 | 2.352 | 2.358 | 2.334 | 2.276 | 2.190 | 2.058 | 1.890 | 1.688 | 1.464 | 1.205 |
| | | D | | | | A | | | | A | | |
| | | 2.358 | | | | 2.334 | | | | 1.890 | | |
| | | | | | | 2.113 | | | | | | |
| | | 0.244 | | | | 0.220 | | | | −0.224 | | |
| | | 0.244 | | | | 0.220 | | | | 0.000 | | |
| | | 0.600 | | | | 0.600 | | | | 0.600 | | |
| | | 0.147 | | | | 0.132 | | | | 0.000 | | |

POWER LIMITING CIRCUIT

TECHNICAL FIELD

This invention relates to a power limiting circuit, and more particularly, to a circuit which puts a limitation on power to be input to a transmission power amplifier (power amplifier) or the like provided in a digital high-speed wireless communication system in the field of digital signal processing implemented by an application specific integrated circuit (ASIC) or a microprocessor.

BACKGROUND ART

In recent years, in the field of digital high-speed wireless communication systems, in order to meet the demands of the market for improved efficiency of frequency band usage and high-speed data communications, high-efficiency multiplexing schemes, such as code division multiple access (CDMA) and orthogonal frequency division multiplexing (OFDM), have been widely employed. Those schemes have a feature that a plurality of carriers and codes are multiplexed upon generation of a transmission signal to cause instantaneous power (peak factor or crest factor) which is much higher than average power of the transmission signal. This puts a hard limitation on design of a transmission signal amplifier (transmission power amplifier).

In order to transmit a distortion-free transmission signal, the transmission power amplifier provided in a wireless communication device is required to have linear input/output characteristics, ideally as indicated by $T(x)$ of FIG. 2. However, the actual input/output characteristics of the power amplifier exhibit non-linearity in the high output region as indicated by $E(x)$, resulting in saturation. The use of a non-linear region increases the radiation level outside a desired frequency band. For that reason, an average operating point of the power amplifier is lowered to ensure a sufficient backoff with respect to an output saturation point (i.e., a margin from the operating point to the saturation point of FIG. 2), to thereby use only a linear region so as to suppress the radiation level outside the desired band.

It is therefore necessary to provide a larger backoff as the instantaneous power becomes larger, which means that suppressing the instantaneous power contributes to high efficiency and power saving of the power amplifier. Suppressing the instantaneous power inevitably results in signal degradation, and hence a technology for suppressing the instantaneous power with minimum signal degradation has been sought after.

The related art for realizing this is a method involving power limitation using a window function as described in Japanese Unexamined Patent Application Publication (JP-A) No. 2007-306346 (Patent Document 1).

Further, another related art is a method described in Japanese Unexamined Patent Application Publication (JP-A) No. 2008-078943 (Patent Document 2).

DISCLOSURE OF THE INVENTION

The related art that limits power using the window function suffers from a problem of degradation in frequency spectrum or error vector magnitude (EVM) of the transmission signal. The reason is described below.

The related art and this invention assume that a digital signal to be input to the power limiting circuit is a signal whose band is limited by a linear phase filter. It is apparent from the configuration of the linear phase filter that the band-limited digital signal can be decomposed for each sampling into a set of impulse responses. FIGS. 3A and 3B respectively illustrate an example of passing two successive impulses through the linear phase filter and an example indicating that the band-limited signal is the sum of the respective impulse responses.

If the above-mentioned band-limited signal is subjected to power limitation by the technology described in Patent Document 1, the resultant waveform differs from a waveform of the impulse response. FIGS. 4A and 4B illustrate the output of the power limiting circuit according to the related art in time axis representation and frequency axis representation, respectively. Although the difference is not clearly understood from the time axis of FIG. 4A, the resultant signal differs from the original impulse response because the multiplier for imposing a limitation attenuates as a window function with distance from the center of the signal. Referring to the frequency axis representation of FIG. 4B, it can be confirmed that the signal band is widened. It can be therefore understood that the related art that limits power using the window function causes distortion in transmission frequency spectrum. The distorted transmission spectrum affects signals in adjacent channels, causing degradation in receiving characteristics. It is therefore a first problem to be solved by this invention to suppress the maximum power value to attain a distortion-free transmission spectrum.

A commonly-used method for solving the first problem is the method as illustrated in FIG. 2 of Patent Document 2, in which a peak signal is generated and subjected to band limitation and is then subtracted from a main signal. However, the technology described in Patent Document 2 performs the peak suppression processing on an over-sampled signal, and hence the processing needs to be performed at high speed. This leads to a problem that the circuit size is increased or a problem that the operation speed becomes faster to increase power consumption. Further, the band is uniformly limited, which also makes it impossible to collect the peak signals into a carrier with relaxed standards in the multi-carrier case. According to this invention, a maximum value of signal power to be generated at a subsequent stage is predicted so as to allow the circuit to operate at low operation speed. Besides, the coefficient of the band limiting filter is made variable so that the attenuation rate may be changed depending on the band, thereby being capable of adjusting the degree of influence of the peak signal on a carrier.

In view of the foregoing, this invention seeks to provide a power limiting circuit having a feature of suppressing the radiation level outside a desired frequency band within a permissible range, and suppressing a loss of average power and a loss of backoff as much as possible, in particular a feature of suppressing the radiation level outside a desired frequency band as compared to the conventional art. Further, this invention seeks to provide a power limiting circuit in which the operation speed of the limiting circuit is lowered to reduce power consumption as compared to the related art.

According to an aspect of this invention, there is provided a power limiting circuit for outputting an input signal by limiting a maximum instantaneous power value of the input signal to a predetermined power value or less, including: a maximum value prediction filter section (11) for calculating in advance a maximum instantaneous power value at a time of analog output; a maximum value detection section (12) that detects a maximum value of an output of the maximum value prediction filter section every constant period, and outputs the maximum value and a time detection position thereof; a threshold subtraction section (13) that subtracts a threshold from the maximum value; a coefficient selection section (14)

that weights an output signal of the threshold subtraction section (13) according to the time detection position at which the maximum value is detected; a complex filter section (15) that imposes a band limitation on a value to be subtracted, which is output from the coefficient selection section (14); a filter coefficient calculation section (16) that calculates a filter coefficient of the complex filter section (15); a delay adjustment section (17) for processing delay adjustment; and a subtraction section (18) that subtracts from a main signal the band-limited signal to be subtracted.

According to this invention, the maximum value is detected to calculate a peak value of a signal in advance, thereby increasing the precision of peak signal suppression for a transmission signal, and the peak signal to be subtracted is subjected to the band limitation, thereby suppressing the peak signal without degrading a band outside the transmission spectrum band. Further, when the peak signal to be subtracted is subjected to the band limitation, the attenuation amount is controlled for each carrier, which makes it possible to control the ratio of distribution among the carriers and reduce power distribution to a carrier with strict standards. Therefore, this invention provides at least one of the following effects.

The first effect is that, when the peak signal is suppressed with respect to average power, the signal spectrum is not deteriorated. The reason is that the peak signal to be subtracted is subjected to the same band limitation as the input signal and accordingly the out-of-band spectrum is not generated because the signals in which the same band limitation is imposed are added or subtracted.

The second effect is that the provision of the means for varying, depending on the band, the ratio of distributing the peak signals to be subtracted makes it possible to collect the peak signals into a band with relaxed standards so as to reduce the influence on a band with strict standards.

The third effect is that the peak signal at a subsequent stage is predicted to suppress the operation speed for peak suppression of this invention. Suppressing the operation speed is equivalent to suppressing the circuit size and hence contributes to reduced power consumption.

The fourth effect is that the maximum value of the output signal is suppressed to reduce power consumption of a power amplifier which is required for a system embedding the power amplifier at a subsequent stage, to thereby contribute to reduced power consumption of the overall device.

BRIEF DESCRIPTION OF THE DRAWING

FIG. 21 is a table showing operations of the maximum value detection section 12, the coefficient selection section 14, and the complex filter section 15.

BEST MODE FOR EMBODYING THE INVENTION

Figure 1:
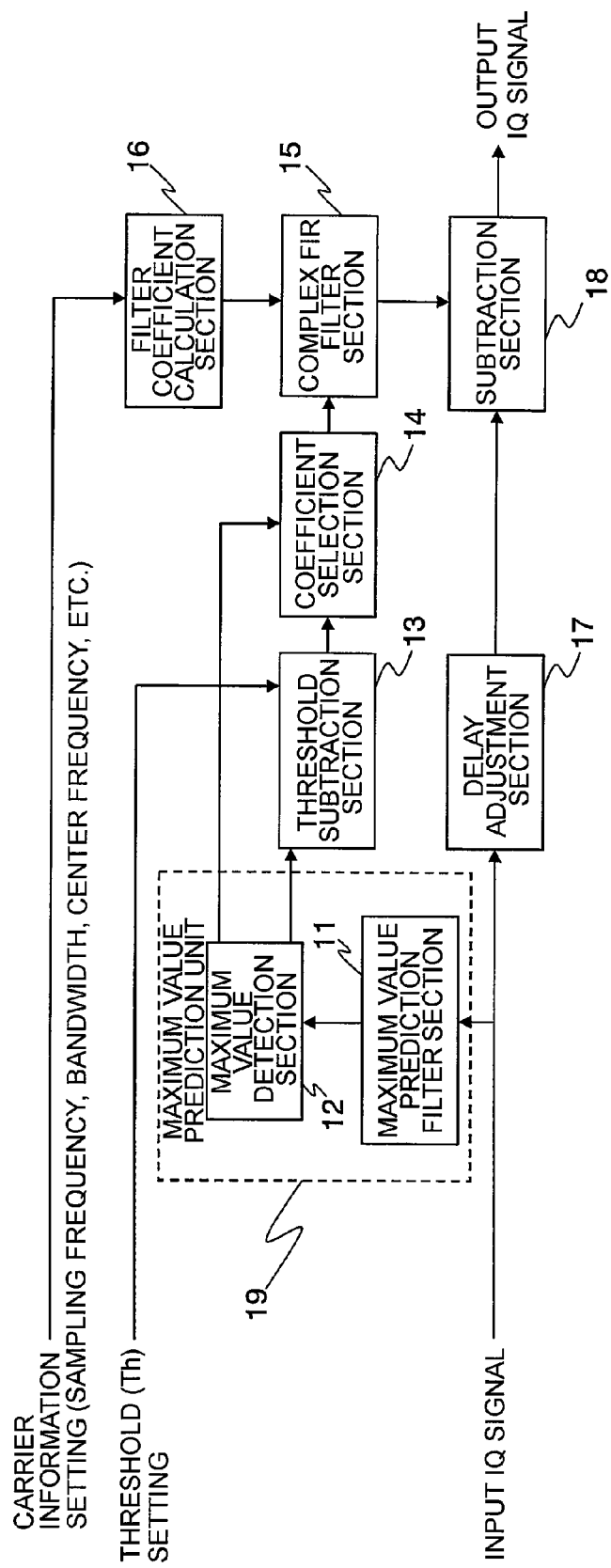
FIG. 1 is a block diagram of a power limiting circuit according to a first embodiment of this invention.
Figure 2:
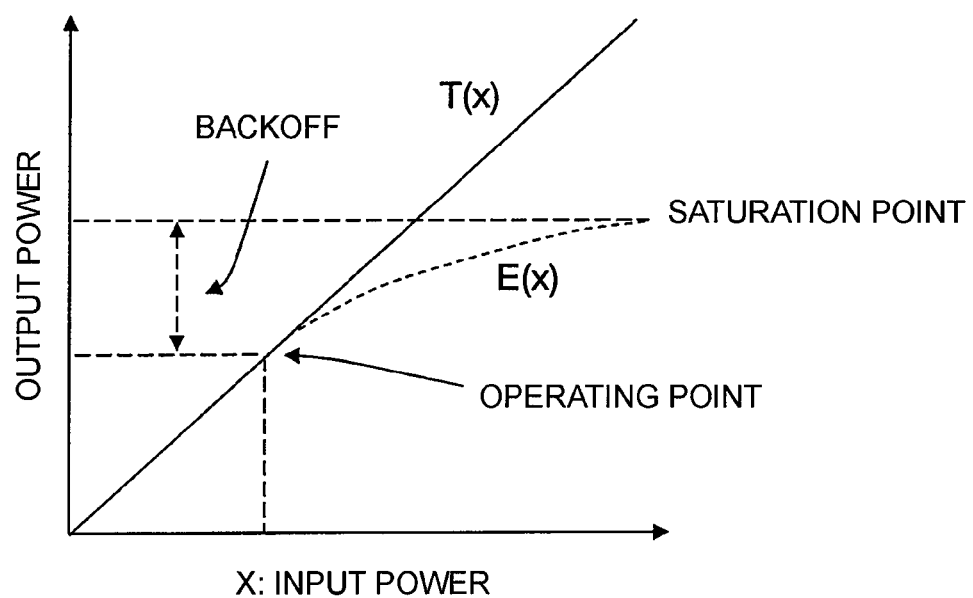
FIG. 2 is a graph illustrating input/output characteristics of a power amplifier.
Figure 3A:
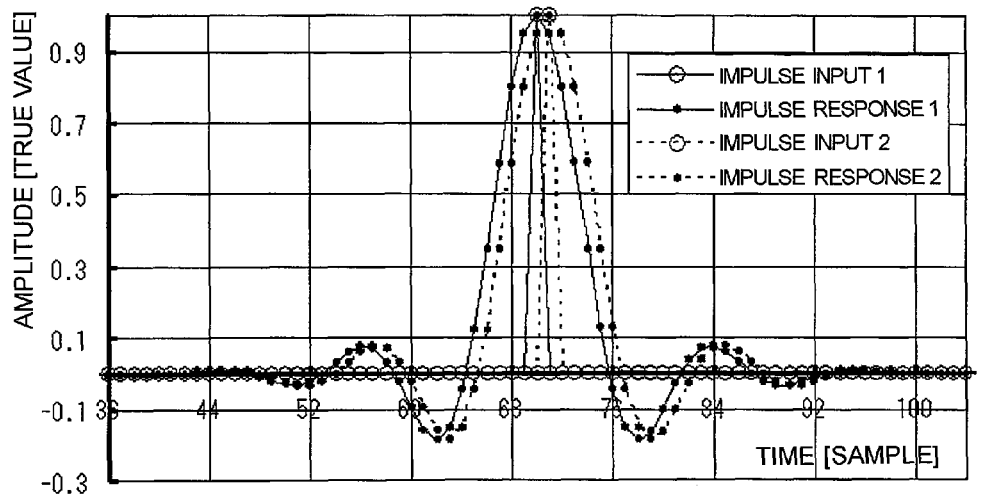
FIG. 3A is a graph illustrating two impulse inputs and impulse responses thereof in a superimposing manner.
Figure 3B:
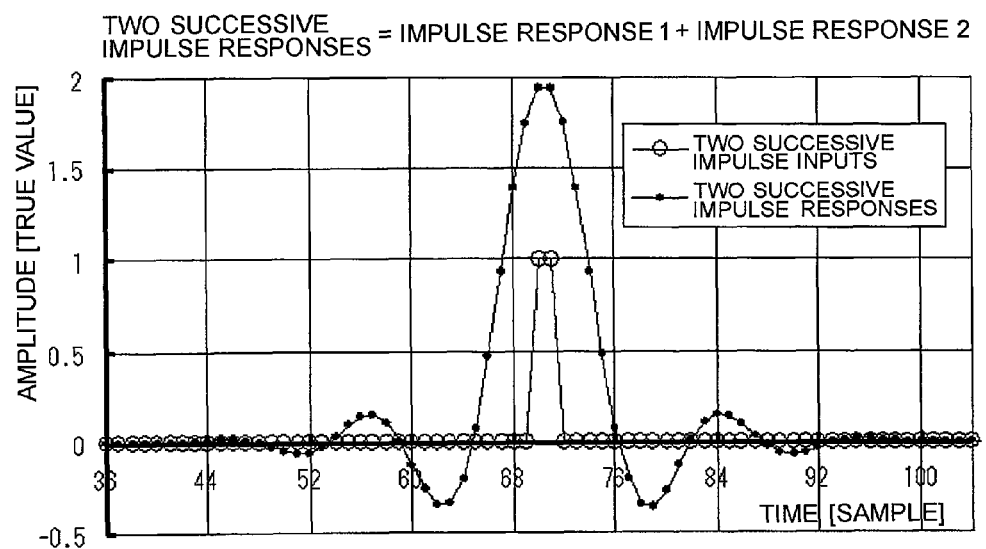
FIG. 3B is a graph illustrating an impulse response to two successive impulse inputs, illustrating that the impulse response to the successive impulse inputs is the addition of the respective impulse responses with the increased amplitude.
Figure 4A:
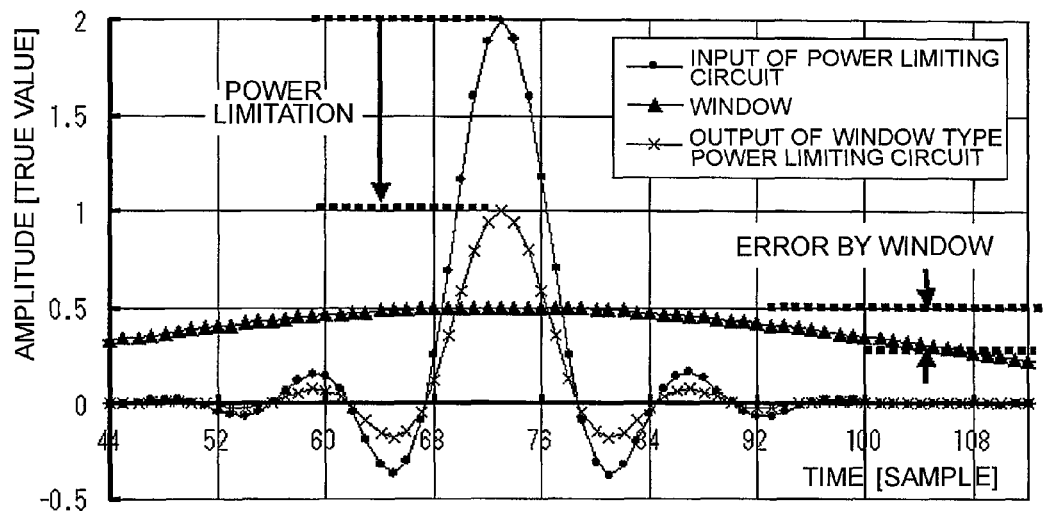
FIG. 4A is a graph illustrating a time axis waveform of an output of a power limiting circuit according to the related art.
Figure 4B:
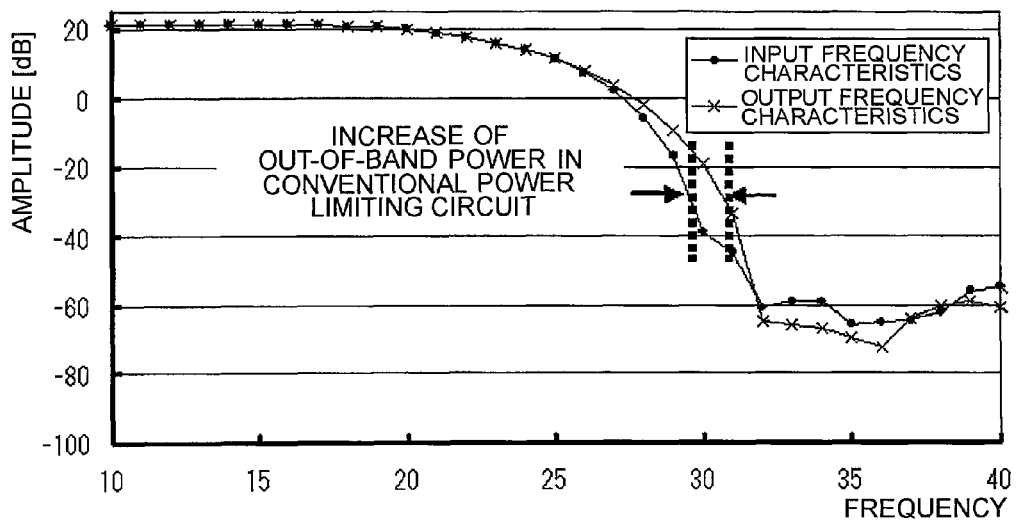
FIG. 4B is a graph illustrating a frequency axis waveform of the output of the power limiting circuit according to the related art.

Next, referring to the drawings, embodiments of this invention are described in detail.

FIG. 1 is a block diagram illustrating a configuration of a power limiting circuit according to a first embodiment of this invention.

The illustrated power limiting circuit is a power limiting circuit for outputting an input signal by limiting a maximum instantaneous power value of the input signal to a predetermined power value or less. The power limiting circuit includes a branch section that branches an input IQ signal which is quantized at a first sampling rate, a maximum value prediction filter section 11 that interpolates one of the branched input signals at a second sampling rate higher than the first sampling rate, a maximum value detection section 12 that outputs a maximum value of the signal interpolated by the maximum value prediction filter section 11 and a time detection position thereof every constant period corresponding to the first sampling rate, a threshold subtraction section 13 that outputs, as a peak signal, a result obtained by subtracting a preset threshold from the maximum value, the peak signal being 0 (zero) when the subtraction result is negative, a coefficient selection section 14 that weights the peak signal according to the time detection position, a complex (FIR) filter section 15 that imposes a band limitation on the weighted peak signal output from the coefficient selection section 14, a filter coefficient calculation section 16 that calculates coefficients of the complex filter section 15, a delay adjustment section 17 that delays another of the branched input signals by a delay of processing from the maximum value prediction filter section 11 to the complex filter section 15, and a subtraction section 18 that subtracts the band-limited peak signal, which is an output of the complex filter section 15, from the other of the branched input signals which is subjected to delay adjustment by the delay adjustment section 17. The details are described below.

A maximum value prediction unit 19 is constituted by the maximum value prediction filter section 11 and the maximum value detection section 12, and predicts a maximum value of the amplitude of a transmission signal generated at a subsequent stage. This part is caused to operate at a higher speed than other components in order to perform a prediction operation.

Figure 5:
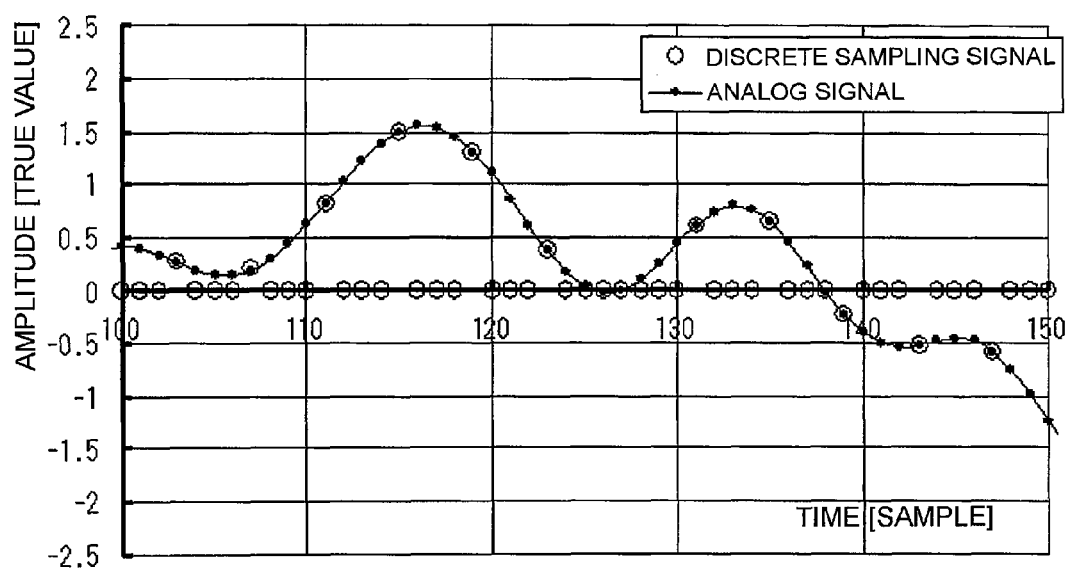
FIG. 5 is a graph illustrating that, in a case of conversion into analog signals between discrete sampling signals, signals exist between samplings and a maximum value point exists other than a sampling point.
Figure 6:
FIG. 6 is a block diagram illustrating a configuration example for allowing the power limiting circuit of this invention to operate in a processing system at low sampling frequency.

The maximum value prediction filter section 11 calculates signals existing in a digital sampling interval. In general, a wireless transmitter transmits a transmission digital signal after conversion into a transmission analog signal, and hence signals between samplings are also output as illustrated in FIG. 5. Accordingly, the maximum instantaneous power value (peak value) can be larger than a digital input signal. For that reason, the maximum value prediction filter section 11 interpolates data to calculate a true peak value in advance, to thereby improve the precision of signal level to be actually suppressed. Another reason why the maximum value prediction filter section 11 is provided is that, in a case where a digital upsampling filter for digital signal processing is disposed as illustrated in FIG. 6, it becomes possible to limit power at a position at low sampling rate. The processing at the position at low sampling rate allows for a small circuit size and leads to another advantage of producing a margin in operation speed. However, the processing at low sampling rate means the use of a signal point at a position shifted from the actual sampling point on the time axis, with the result that the precision is deteriorated as compared to processing at high sampling rate. This is a tradeoff between the circuit size and the precision of processing delay time.

Figure 7:
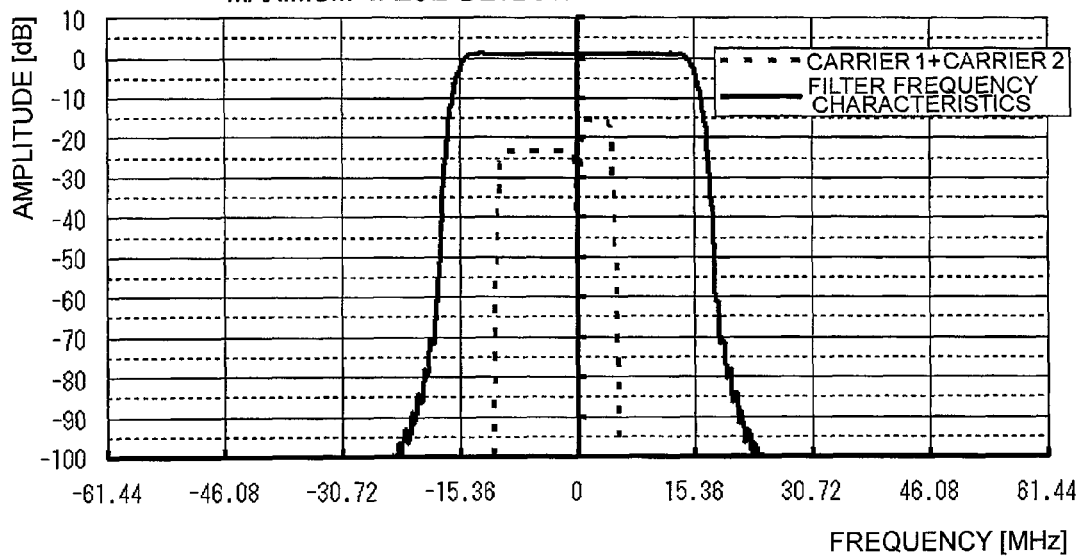
FIG. 7 is a graph illustrating an example of frequency characteristics of a maximum value prediction filter section 11 included in the power limiting circuit of FIG. 1.

Further, frequency characteristics of the maximum value prediction filter section 11 are calculated so as to enable four-times upsampling having the same band as the band of the transmission signal. FIG. 7 illustrates an example of the frequency characteristics. As illustrated in FIG. 7, the filter is set to have a pass band over the carriers. In the first embodiment of this invention, the maximum value prediction filter is configured to enable four-times upsampling. However, upsampling of more than four times further improves the peak suppression performance. Note that, in the modulation scheme of CDMA or OFDM, if a signal to be input to the power limiting circuit is subjected to a band limitation at the eight-times sampling rate, the improving effect against the increase in circuit size cannot be obtained practically in comparison with four-times sampling (8×4=32-times sampling after maximum value prediction filtering) and more.

Figure 8:
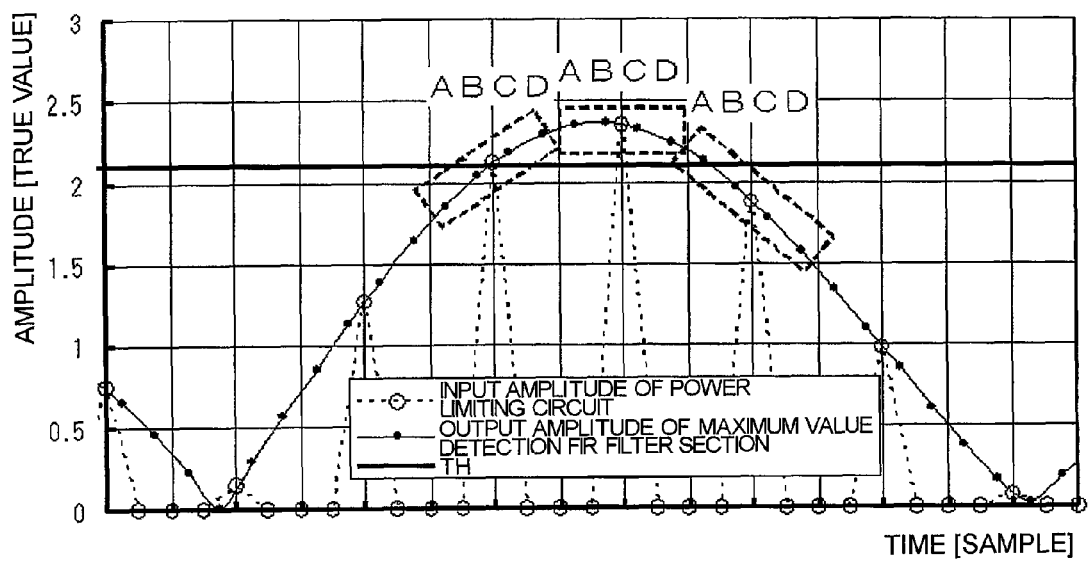
FIG. 8 is a graph for illustrating a detection operation of a maximum value detection section 12 included in the power limiting circuit of FIG. 1.
Figure 9:
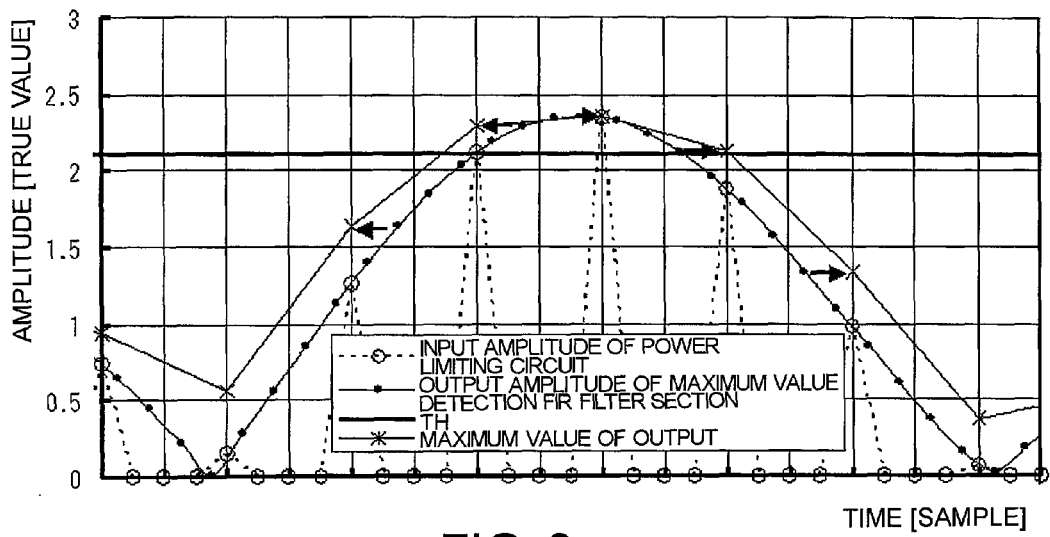
FIG. 9 is a graph illustrating results of maximum value detection of the maximum value detection section 12.

Next, the maximum value detection section 12 detects a maximum value of the output signal of the maximum value prediction filter section 11. The maximum value is detected every constant period corresponding to the sampling rate of the input signal. In this embodiment, because the maximum value prediction filter section 11 performs four-times upsampling, the maximum values of power are detected in each group of four points (A, B, C, and D) as illustrated in FIG. 8. The results of detection are illustrated in FIG. 9. The maximum value detection section 12 outputs a signal corresponding to each detected maximum value. The output rate is the same as the sampling rate of the input signal. The signals to be output are not power values but IQ signals. Further, in the detection of the maximum value, it is also determined that which position of A, B, C, and D a time detection position is. The reason why the time detection position is determined is described together with description of an operation of the coefficient selection section 14.

Figure 10:
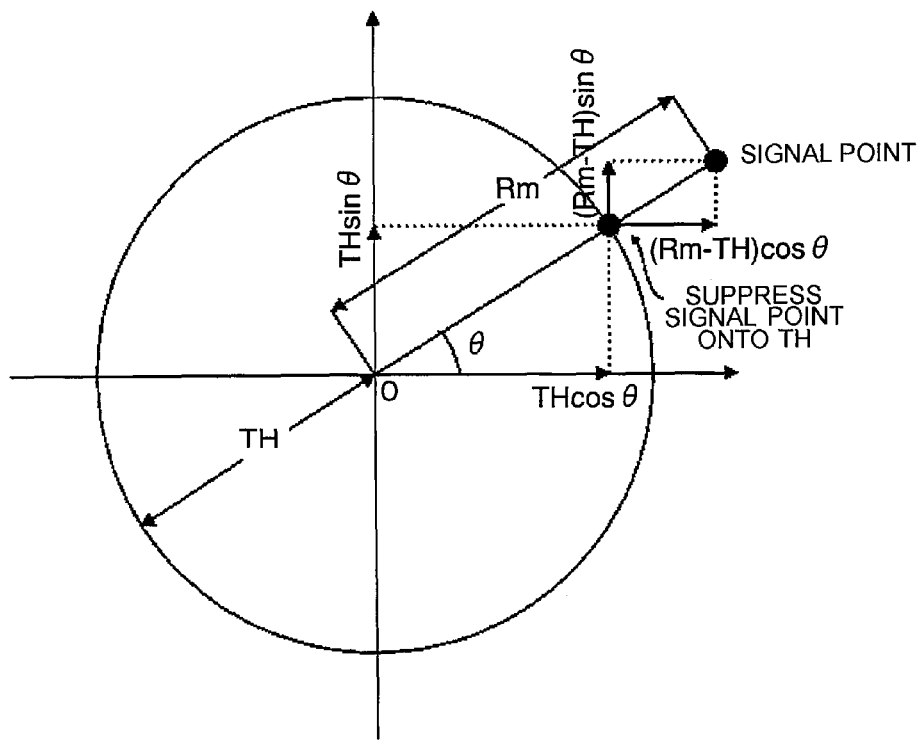
FIG. 10 is a graph for illustrating an operation of a threshold value subtraction section 13 included in the power limiting circuit of FIG. 1 in polar coordinate representation.

The threshold subtraction section 13 subtracts a threshold (Th), which can be arbitrarily set, from the amplitude (Rm) of the signal (Rm·exp(jθ)) obtained after the detection of the maximum value. The subtraction results in (Rm−Th)·exp(jθ), where exp(jθ)=cos θ+j sin θ (j is an index representing an imaginary). Of the subtraction results, a signal point of (Rm−Th)<0 is output after being subjected to processing in which the signal is regarded as 0 (zero) level. From representation on the complex plane illustrated in FIG. 10, this subtraction processing can be understood as processing of calculating a vector value for limiting the signal point with the amplitude of Th or more to Th without changing the phase of the signal point.

Figure 22:
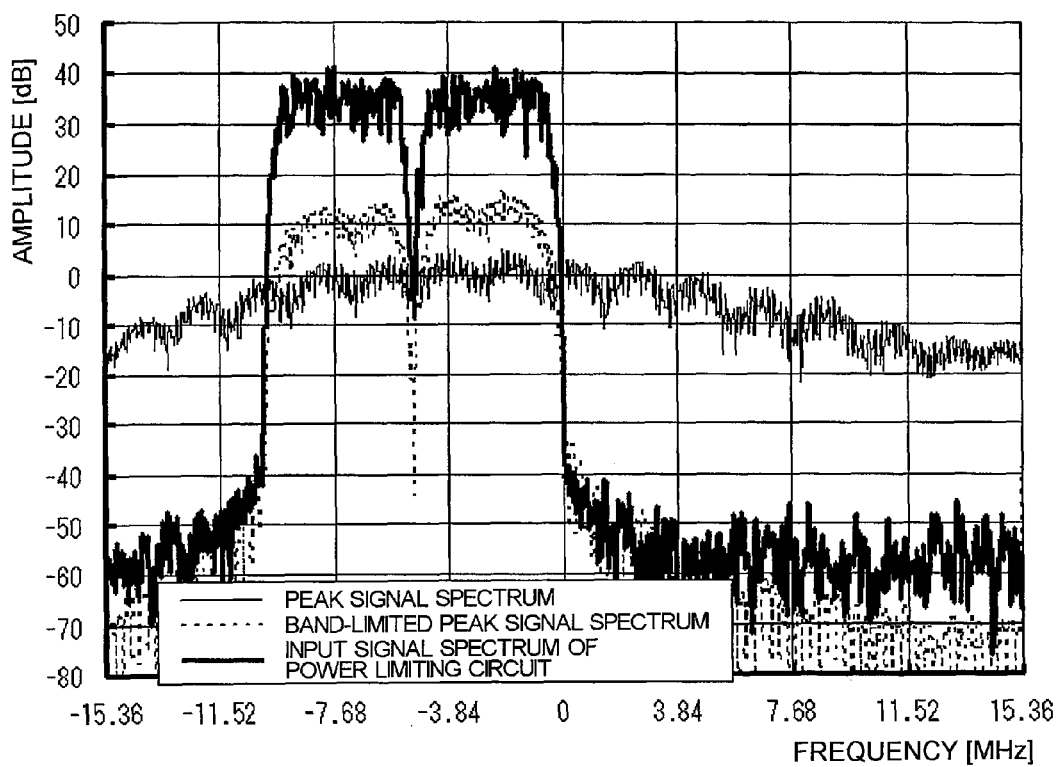
FIG. 22 is a graph illustrating frequency characteristics of the input signal of the power limiting circuit, a peak signal before a band limitation, and a band-limited peak signal.

The peak signal is subjected to Fourier transform to calculate its frequency characteristics as illustrated in FIG. 22. For easy understanding, a spectrum of the transmission signal is also illustrated in a superimposing manner. FIG. 22 illustrates that the peak signal has a frequency spectrum over the entire band similarly to an impulse signal, and hence if the peak signal is simply subtracted from the transmission signal, an out-of-band spectrum of the transmission signal is deteriorated. In view of this, it can be understood that the deterioration in out-of-band spectrum of the transmission signal is eliminated if the peak signal is subjected to a band limitation before the peak signal is subtracted.

The coefficient selection section 14 performs the following processing with the use of the time detection positions (A, B, C, and D) obtained by the maximum value detection section 12. In the case of detection at A or D, there is a high possibility that a peak is also detected in an adjacent sample, and accordingly the detected maximum value is weighted by 0.6. In the detection at B or C, the detected position is regarded as a peak position, and hence the detected maximum value is multiplied by 1.0, that is, no weighting is performed. The reason why the weighting is performed is that the successive peak values have overlapping impulse responses and result in excessive peak signals, which is also described in description of the complex finite impulse response (FIR) filter section 15.

Figure 11:
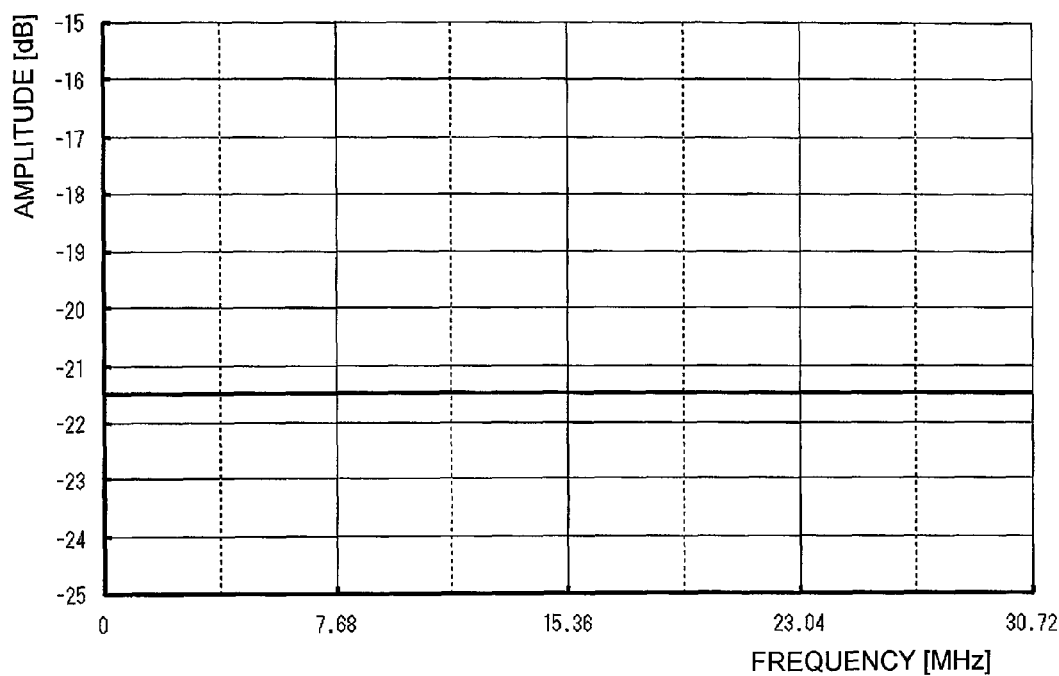
FIG. 11 is a graph illustrating frequency characteristics of an impulse signal.

The complex filter section 15 performs a band limitation on the peak signal weighted by the coefficient selection section 14. The band limitation is performed in order to suppress the band of the peak signal to be subtracted within the band of the transmission signal. If the peak signal to be subtracted is an impulse, the frequency characteristics have a flat characteristic over the entire band as illustrated in FIG. 11. Therefore, if the peak signal is subtracted from the transmission signal, the frequency characteristics of the peak signal are superimposed to deteriorate the transmission spectrum. For that reason, if the peak signal is subjected to the band limitation, the transmission spectrum is not affected because no signal exists in a band outside the band of the transmission signal even after the peak signal is subtracted.

Figure 12:
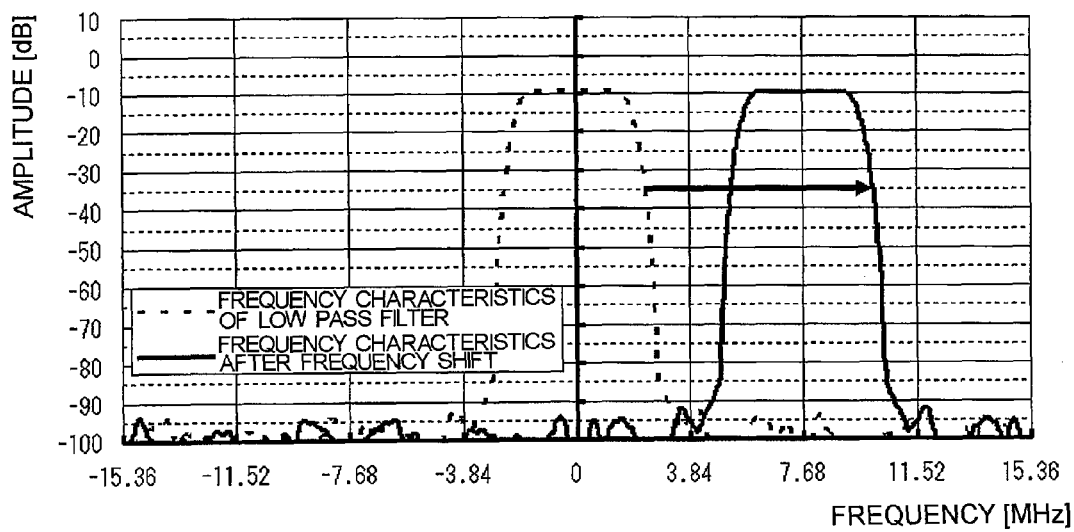
FIG. 12 is a graph illustrating frequency characteristics of a single-carrier low pass filter and an example of frequency shift.
Figure 13:
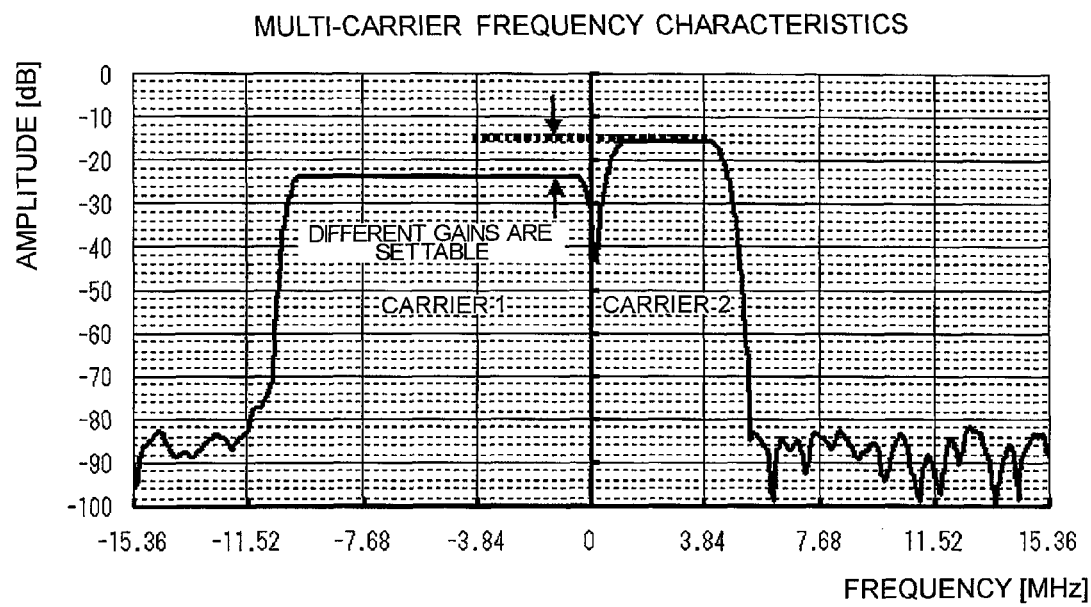
FIG. 13 is a graph illustrating an example of varying the attenuation amount depending on a carrier in the multi-carrier case.
Figure 14:
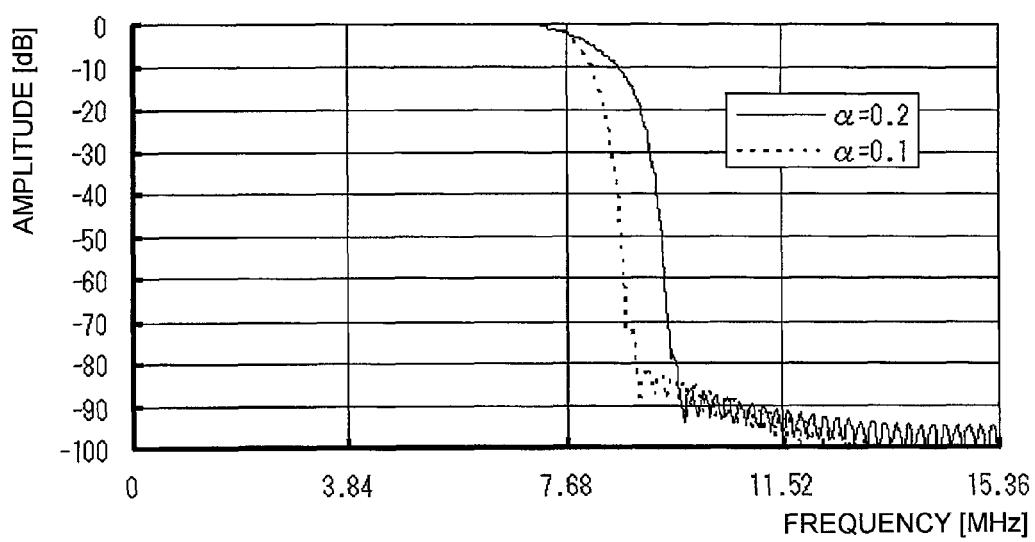
FIG. 14 is a graph illustrating that a coefficient of a complex filter section 15 included in the power limiting circuit of FIG. 1 is set to be narrower than an input signal band of the power limiting circuit.
Figure 15:
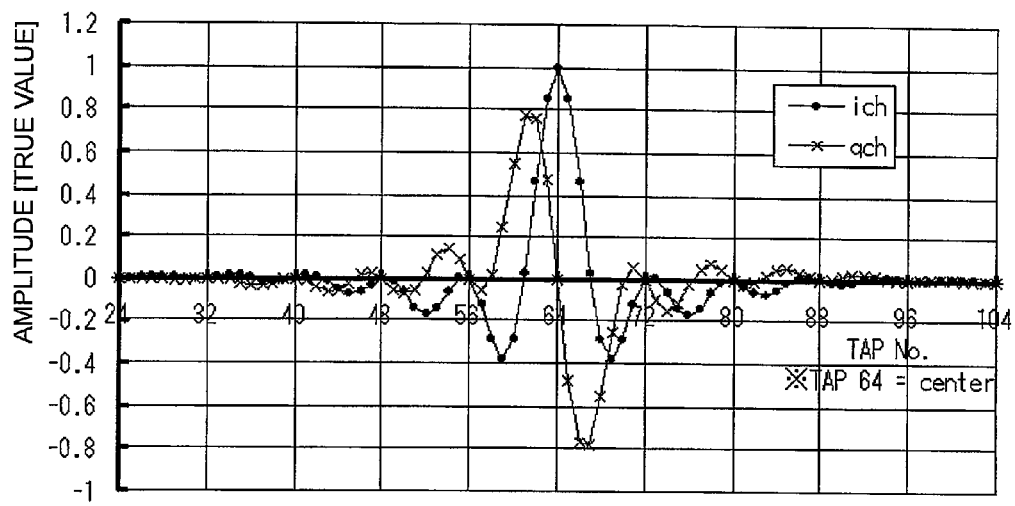
FIG. 15 is a graph illustrating that the coefficient of the complex filter section 15 is designed so as to obtain 1.0+j0.0 at a center tap, illustrating an example in which the input signal band of the power limiting circuit is a band pass band.
Figure 16:
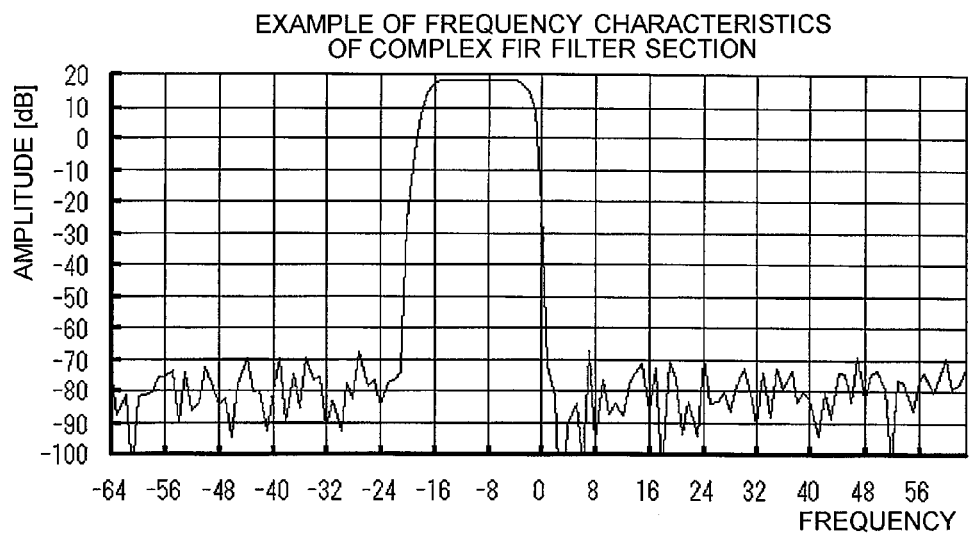
FIG. 16 is a graph illustrating an example of frequency characteristics of the complex filter section 15.

The filter coefficient calculation section 16 calculates filter coefficients for limiting the above-mentioned peak signal within a carrier band. The filter coefficients are determined so as to perform a desired band limitation according to the type, the signal band, or the frequency characteristics (sampling frequency, bandwidth, center frequency, etc.) of each carrier constituting the input signal. By changing the coefficients of a low pass filter so as to frequency-shift the pass band as illustrated in FIG. 12, the pass band can be disposed at any frequency. The frequency shift can be realized, for example, by executing processing illustrated by a flowchart of FIG. 23. In the multi-carrier case, the attenuation amount of a filter can be varied depending on a band as illustrated in FIG. 13, which is a feature that power of the above-mentioned peak signal to be subtracted can be reduced for a carrier with strict standards. As illustrated in FIG. 14, the frequency characteristics of the filters for respective carriers are set to be slightly narrow in the band as compared to the frequency characteristics of the transmission signal. The reason why the band is made narrow is that, if the same frequency characteristics are provided, noise is superimposed at low level in the vicinity of the transmission signal spectrum due to a calculation error. For example, in a case of a transmission signal band in which a roll-off factor α of a roll-off filter, which is commonly known, is 0.2, it is only necessary to design a complex filter having frequency characteristics in which α is 0.1. The gains of the coefficients of the band limiting filter are designed so that a center tap may be 1.0, rather than being calculated so as to obtain the same input/output level. FIG. 15 illustrates examples of the coefficients of the band pass filter. In other words, the coefficients of the band pass filter are also designed so that the center tap may be 1.0. Further, FIG. 16 illustrates an example of the output spectrum obtained when two successive impulses are input to the complex filter section 15. It can be understood from FIG. 16 that, when the two successive impulses are input, the response becomes larger than the input amplitude. In other words, in the case where the peak values to be subtracted are successive, if the complex processing is directly performed, the resultant value becomes larger than the original amplitude, with the result that excessive power limitation is performed to cause degradation in EVM. This is the reason why the peak signal is weighted by the coefficient selection section 14.

The delay adjustment section 17 has a static delay function for adjusting timing of the transmission signal based on a delay processing time from the maximum value prediction to the peak signal band limiting processing.

Figure 17:
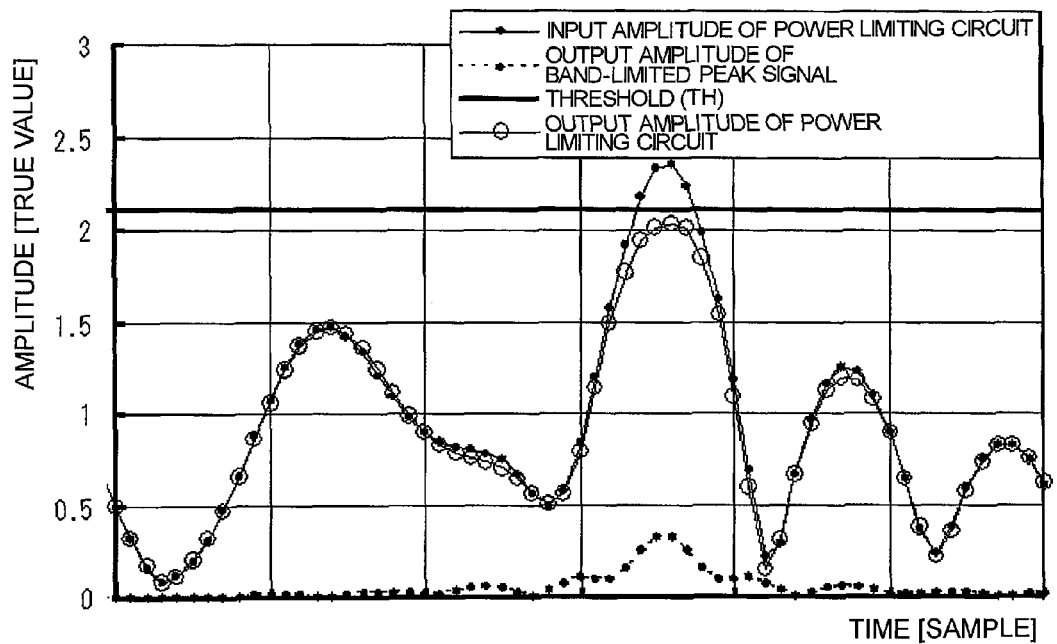
FIG. 17 is a graph illustrating an input amplitude of the power limiting circuit, calculated peak signals to be subtracted, an output amplitude of the power limiting circuit, and a threshold (Th), illustrating that the output amplitude of the power limiting circuit becomes the threshold (Th) or less.

The subtraction section 18 has a function of subtracting the band-limited peak signal. FIG. 17 illustrates an example of the result of the subtraction processing.

Next, an operation of the power limiting circuit of FIG. 1 is described.

Figure 18:
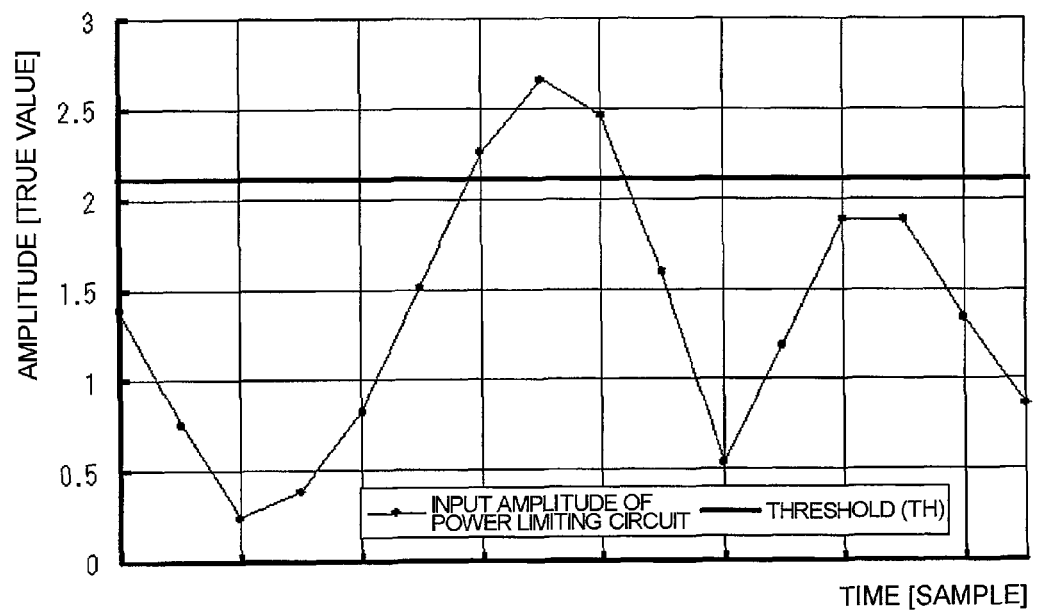
FIG. 18 is a graph illustrating the input amplitude of the power limiting circuit and signals to be suppressed.
Figure 19:
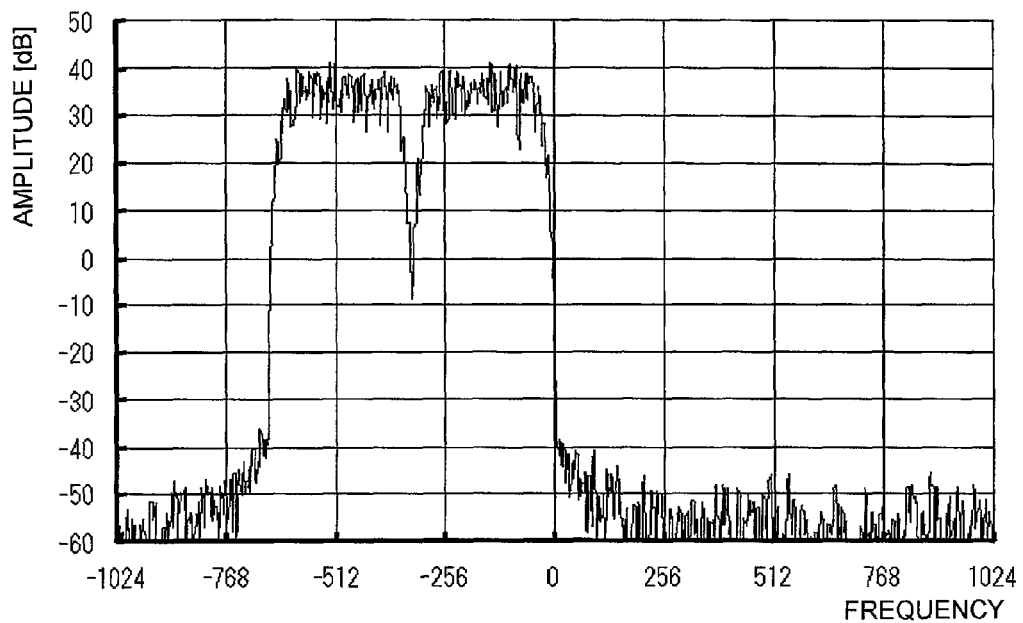
FIG. 19 is a graph illustrating an input signal spectrum of the power limiting circuit.

A complex signal is described as an IQ signal because those skilled in the art often represent the complex signal on the time axis as I+jQ. FIG. 18 illustrates a representation example of the input IQ signal of the power limiting circuit with the time axis and the amplitude. FIG. 19 illustrates a representation example thereof with the frequency. A signal of the threshold Th or higher on the amplitude axis of FIG. 18 is a signal to be suppressed.

Figure 20:
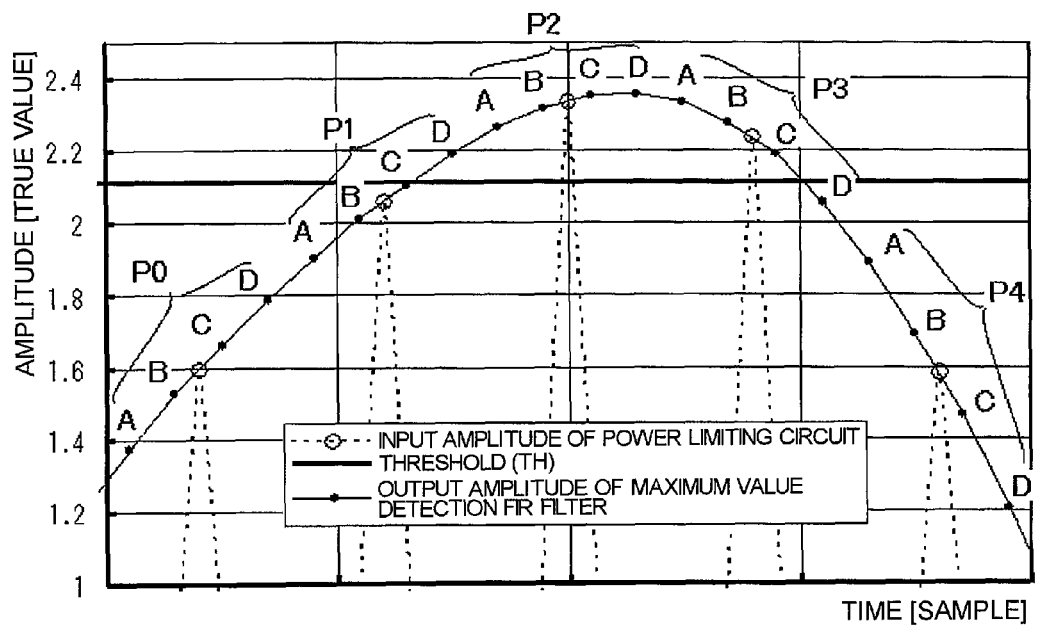
FIG. 20 is a graph illustrating an operation of the maximum value detection section 12.

FIG. 20 illustrates a transmission signal including peak points of Th or higher and the output result of the maximum value prediction filter section 11. Referring to FIG. 20, interpolated values for three points of the point P1, the point P2, and the point P3 exceed the threshold Th.

The maximum value detection section 12 calculates a maximum value and a time detection position with respect to each of the above-mentioned three points exceeding the threshold. FIG. 21 shows a table indicating the relationship between the detection position and the maximum value and the like. Referring to the table, the maximum value of interpolated data of the point P1 is 2.192, and the time detection position is D. The maximum value corresponding to the point P2 is 2.358, and the detection point is D. The maximum value corresponding to the point P3 is 2.334, and the time detection position is A.

Next, the threshold value subtraction section 13 subtracts the threshold from the peak values. The input signal of the threshold value subtraction section 13 is an IQ signal, and hence the unit of the threshold Th is set to a true value of the amplitude. In the description of the operation, the threshold is set to +6.5 [dB] of average power of the input signal of the power limiting circuit, which is then converted into an amplitude value to obtain Th=10^(+6.5/20)≈2.113. As shown in the table of FIG. 21, (maximum value−threshold) is calculated, and the value is regarded as 0 (zero) for the point whose calculation result is negative, thereby obtaining the results of the threshold value subtraction section 13. Those are peak signals to be removed.

The coefficient selection section 14 selects a weighting coefficient based on the time detection position of the maximum value obtained by the maximum value detection section 12. In the case of detection at A or D, 0.6 is selected. In the case of detection at B or C, 1.0 is selected. The time detection positions of the point P1, the point P2, and the point P3 are D, D, and A, respectively, and hence the corresponding weighting coefficients are 0.6, 0.6, and 0.6, respectively. Frequency representations of the weighted peak signals and the input signal of the power limiting circuit are obtained as the peak signal spectra of FIG. 22.

The filter coefficient calculation section 16 calculates filter coefficients according to the carrier band. This operation is performed once upon addition or removal of a carrier. What kind of carrier is added is instructed from the outside.

Figure 23:
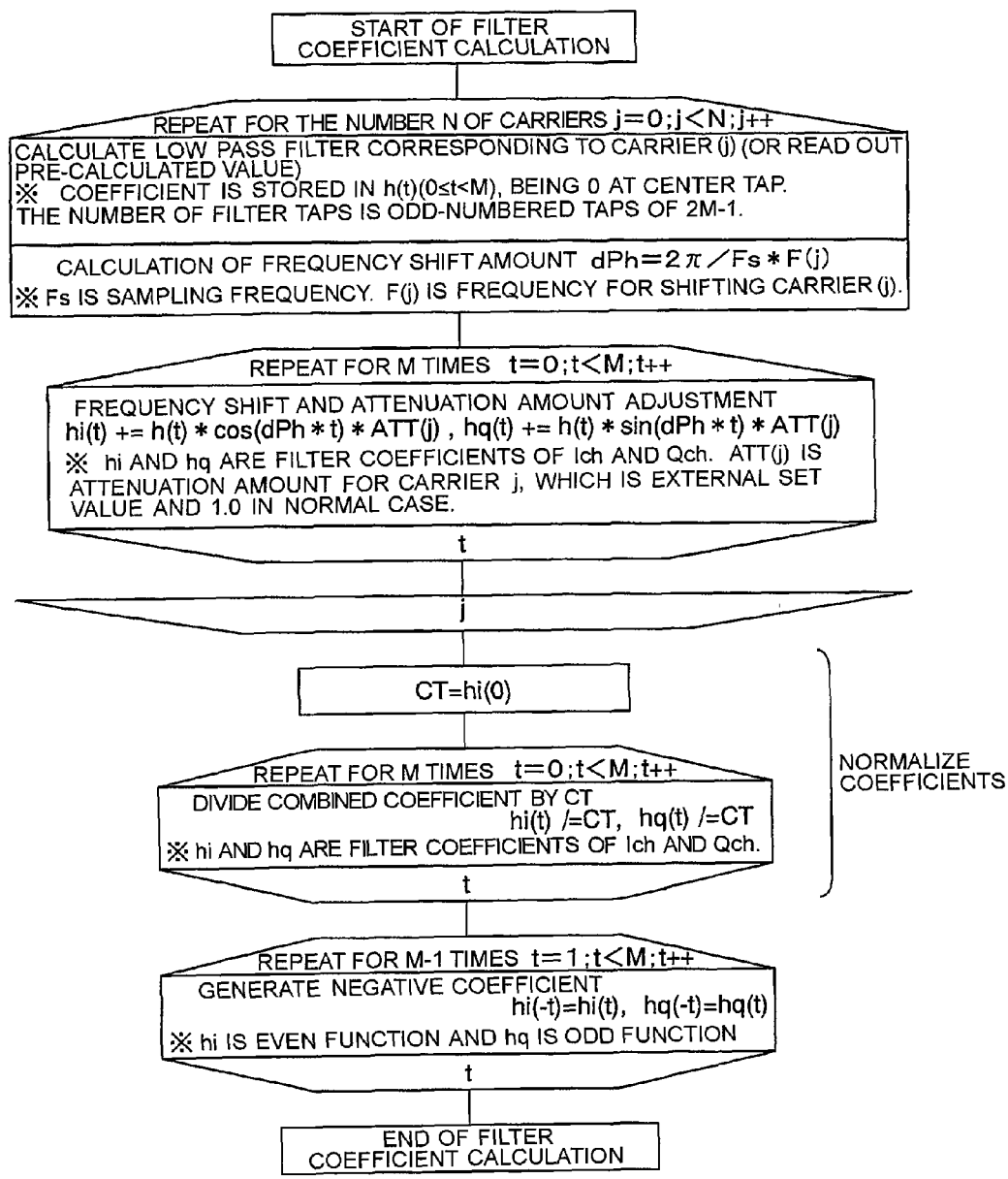
FIG. 23 is a flowchart illustrating an operation of a filter coefficient calculation section 16 included in the power limiting circuit of FIG. 1.
Figure 24A:
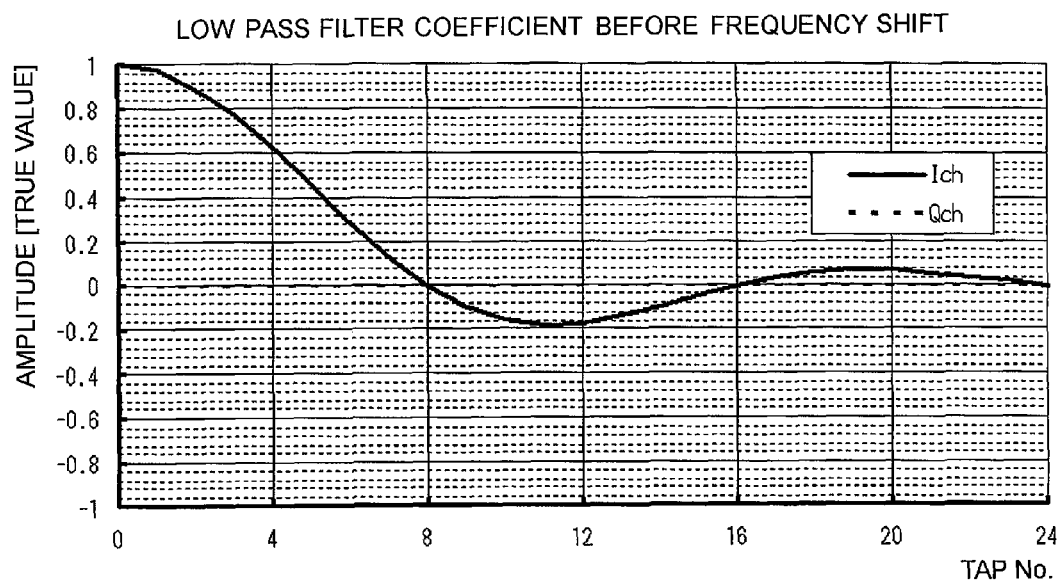
FIG. 24A is a graph illustrating a low pass filter coefficient before frequency shift in amplitude representation.
Figure 24B:
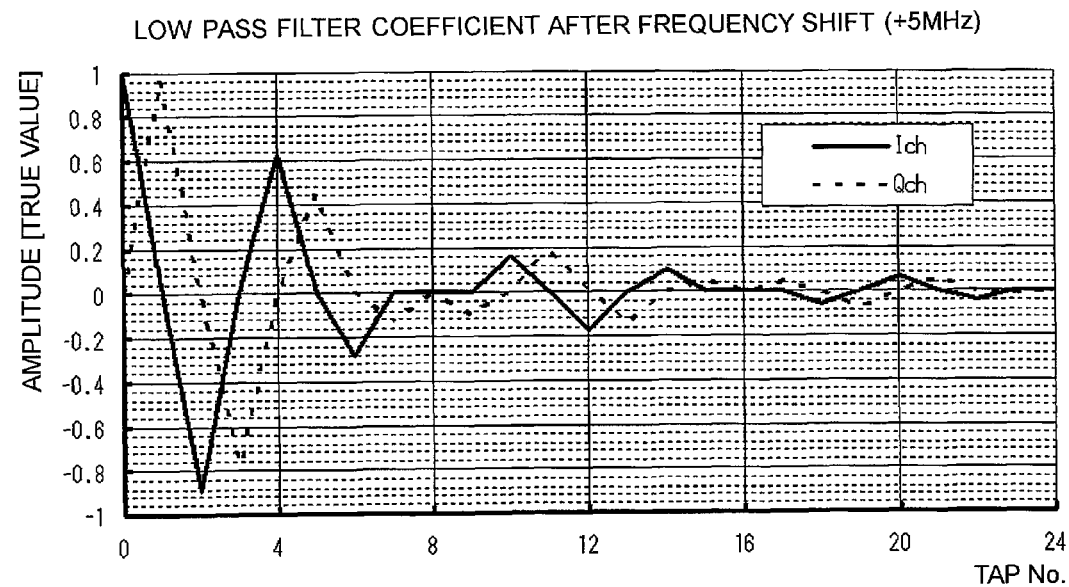
FIG. 24B is a graph illustrating a low pass filter coefficient after frequency shift in amplitude representation.

Referring to an operation flowchart of the filter coefficient calculation section illustrated in FIG. 23, an operation of the filter coefficient calculation section 16 is described. First, a low pass filter having the shape of a carrier band is calculated (the low pass filter may be calculated in advance for each carrier band and may be stored in a nonvolatile memory or the like). FIG. 12 illustrates an example of the low pass filter. Next, calculation of frequency shift to the center frequency of the carrier is performed. As described in the flowchart, the frequency shift is performed by multiplying exp(j2πf/FsΔt), with the center point of the filter coefficients being time t=0, where f is the amount of frequency shift and Fs is a sampling frequency. FIG. 24 illustrate an example of the filter coefficient before and after the frequency shift.

Next, the attenuation amount of the filter is controlled. In the case of distributing the same amount among the carriers, the respective ATT (attenuation rates) may be set to 1.0. As illustrated in FIG. 13, if the attenuation amount of Carrier 1 is increased, power distributed to Carrier 1 is reduced, and hence the influence on Carrier 1 is reduced. Accordingly, it becomes possible to suppress the influence on a carrier with strict standards. Finally, the filter coefficients are normalized so that the center point thereof may be 1.0, thereby completing the filter coefficient calculation.

By removing undesired components of the weighted peak signals by the complex filter section 15, the band-limited peak signal spectrum of FIG. 22 is obtained.

The delay adjustment section 17 delays the branched input IQ signal (main signal) by the same amount of processing delay from the maximum value prediction filter section 11 to the complex filter section 15.

Figure 25:
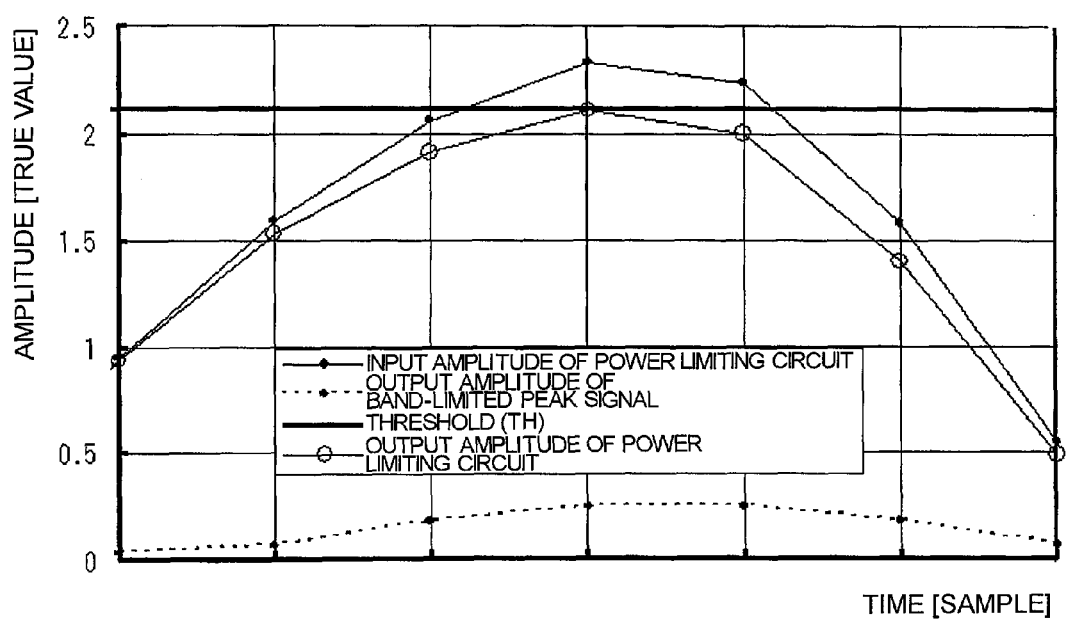
FIG. 25 is a graph illustrating the input amplitude and the output amplitude of the power limiting circuit according to the first embodiment of this invention.

Finally, the subtraction section 18 subtracts the peak signal from the branched input IQ signal of the power limiting circuit and outputs the resultant signal, to thereby obtain an amplitude representation of the power-limited IQ signal of FIG. 25. It can be understood from FIG. 25 that the peak power is limited to Th. Further, FIG. 22 illustrates the input signal of the power limiting circuit and the band-limited peak signal. It can be confirmed from FIG. 22 that the out-of-band radiation level is not deteriorated.

Note that, in the above-mentioned embodiment, the maximum value prediction filter is used for four-times sampling, but may be used for higher-speed sampling. Similarly to the four-times sampling, in the case where a maximum value is detected at each end, the maximum value is weighted by 0.6. Further, the weighting coefficient of the coefficient selection section is set to 0.6, which exhibits good characteristics in a simulation, but may be adjusted to another value.

Another Embodiment of the Invention

Figure 26:
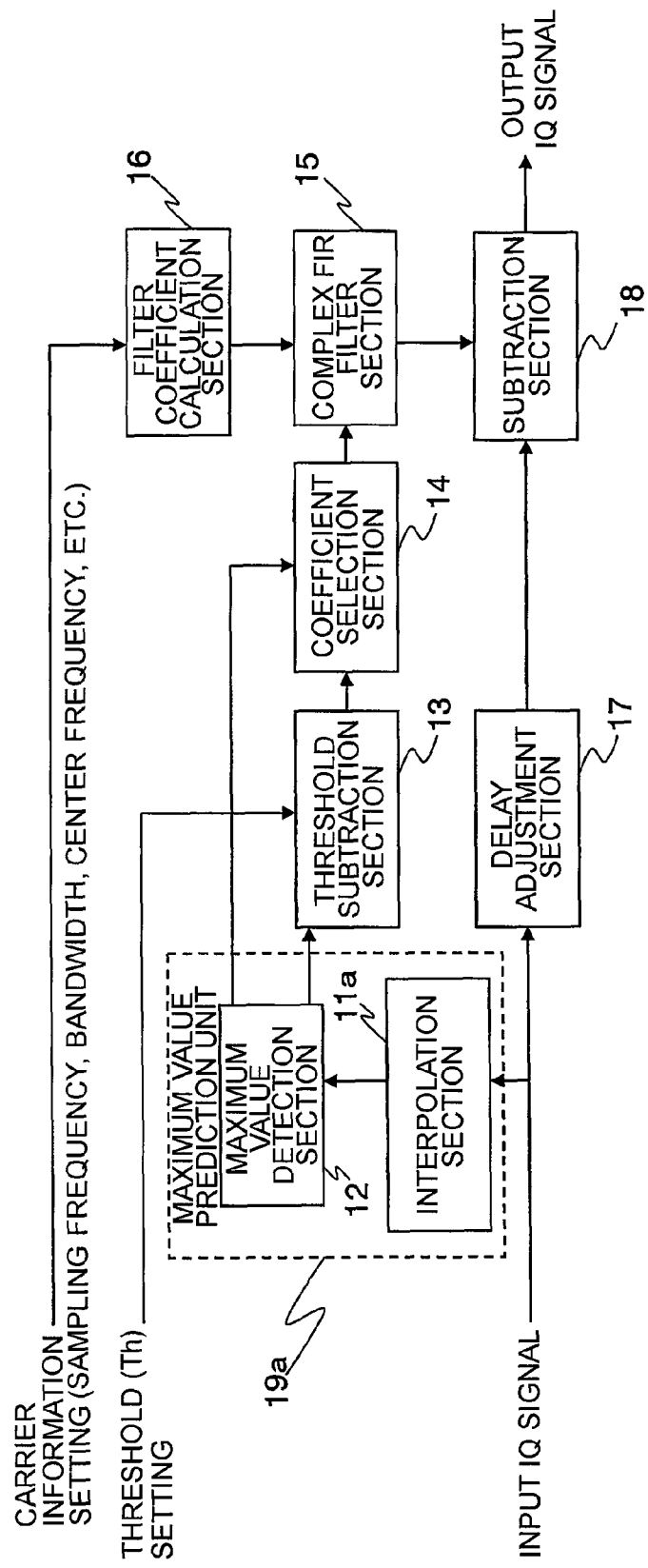
FIG. 26 is a block diagram illustrating a configuration of a power limiting circuit according to a second embodiment of this invention.

FIG. 26 is a block diagram illustrating a configuration of a power limiting circuit according to a second embodiment of this invention. The power limiting circuit according to the second embodiment includes an interpolation section 11a which employs a commonly-used interpolation method, instead of using the maximum value prediction filter section 11 according to the power limiting circuit of FIG. 1. Other configurations and operations are the same as those of the power limiting circuit of FIG. 1. This power limiting circuit has a feature of being capable of reducing the circuit size, though the precision of maximum value prediction is low as compared to the filter type.

In the power limiting circuit of FIG. 1, the digital filter configuration of the maximum value prediction filter section 11 is used to make interpolation between sampling points, to thereby predict the maximum value. However, the filter configuration reproduces a signal waveform at a subsequent stage with accuracy, but tends to increase the circuit size because a large number of multipliers and adders are necessary. The circuit size can be reduced by replacing the maximum value prediction with a commonly-used interpolation method performed by the interpolation section 11a of another embodiment. As an example, if the maximum value prediction is replaced with the Lagrange interpolation method, the circuit can be constituted only by adders, which is commonly known. Thus, the circuit size can be reduced. However, unlike the filter, the precision of the maximum value prediction is lowered because desired frequency characteristics cannot be used and a predicted value of the maximum value differs from an actually-generated maximum value. As described above, there is a tradeoff relationship between the precision of the maximum value prediction and the circuit size. Therefore, depending on the intended purpose, various types of configurations can be employed in the interpolation section 11a.

This invention is described above by way of some embodiments, but this invention is not limited to the above-mentioned embodiments and various modifications and changes can be made thereto not departing from the gist of this invention.

This application is based upon and claims the benefit of priority from Japanese Patent Application No. 2008-325258, filed on Dec. 22, 2008, the disclosure of which is incorporated herein in its entirety by reference.

The invention claimed is:

1. A power limiting circuit for outputting an input signal by limiting a maximum instantaneous power value of the input signal to a predetermined power value or less, comprising:
   a maximum value prediction filter section that interpolates one of branched input signals obtained by branching the input signal, which is quantized at a first sampling rate, at a second sampling rate higher than the first sampling rate;
   a maximum value detection section that outputs a maximum value of the signal interpolated by the maximum value prediction filter section and a time detection position thereof every constant period corresponding to the first sampling rate;
   a first subtraction section that outputs, as a peak signal, a result obtained by subtracting a preset threshold from the maximum value, the peak signal being 0 (zero) when the subtraction result is negative;
   a coefficient selection section that weights the peak signal according to the time detection position;
   a complex filter section that imposes a band limitation on the weighted peak signal output from the coefficient selection section;
   a filter coefficient calculation section that calculates coefficients of the complex filter section;
   a delay adjustment section that delays another of the branched input signals by a delay of processing from the maximum value prediction filter section to the complex filter section; and
   a second subtraction section that subtracts the band-limited peak signal, which is an output of the complex filter section, from the another of the branched input signals which is subjected to delay adjustment by the delay adjustment section.

2. A power limiting circuit according to claim 1, wherein the maximum value of the signal interpolated by the maximum value prediction filter section is detected every constant period corresponding to the first sampling rate, to thereby set an output rate of the maximum value output from the maximum value detection section to be the same as the first sampling rate.

3. A power limiting circuit according to claim 1, wherein the filter coefficient calculation section calculates a coefficient for performing a band limitation according to a type, a signal band, or frequency characteristics of each carrier constituting the input signal.

4. A power limiting circuit according to claim 1, wherein the filter coefficient calculation section changes, in a process of calculating a coefficient for performing a band limitation according to a signal band or frequency characteristics of each carrier constituting the input signal, distribution of amounts to be subtracted based on a type, the signal band, or the frequency characteristics of each carrier.

5. A power limiting circuit according to claim 1, further comprising, instead of the maximum value prediction filter section, an interpolation section that performs interpolation processing without using a filter.

* * * * *